(12) United States Patent
Tan et al.

(10) Patent No.: US 11,296,019 B1
(45) Date of Patent: Apr. 5, 2022

(54) VERTICALLY STRUCTURED PAD SYSTEM

(71) Applicant: Maxim Integrated Products, Inc., San Jose, CA (US)

(72) Inventors: Kwang Hong Tan, Singapore (SG); Mihalis Kolios Michael, San Jose, CA (US); David Alan Pruitt, Morgan Hill, CA (US)

(73) Assignee: Maxim Integrated Products, Inc., San José, CA (US)

( * ) Notice: Subject to any disclaimer, the term of this patent is extended or adjusted under 35 U.S.C. 154(b) by 64 days.

(21) Appl. No.: 16/945,145

(22) Filed: Jul. 31, 2020

Related U.S. Application Data (60) Provisional application No. 62/881,485, filed on Aug. 1, 2019.

(51) Int. Cl.
| | |
|---|---|
| *H01L 23/52* | (2006.01) |
| *H01L 23/498* | (2006.01) |
| *H01L 23/00* | (2006.01) |
| *H01L 21/48* | (2006.01) |

(52) U.S. Cl.
CPC .... *H01L 23/49838* (2013.01); *H01L 21/4853* (2013.01); *H01L 23/49816* (2013.01); *H01L 23/562* (2013.01)

(58) Field of Classification Search
CPC ........... H01L 21/4853; H01L 23/49838; H01L 23/49816; H01L 23/562

USPC ......................................................... 257/738
See application file for complete search history.

(56) References Cited

U.S. PATENT DOCUMENTS

| | | | | |
|---|---|---|---|---|
| 6,384,343 | B1* | 5/2002 | Furusawa | ........... H01L 23/3107 174/260 |
| 6,683,387 | B1 | 1/2004 | Brownfield | |
| 7,015,590 | B2* | 3/2006 | Jeong | ................... B23K 3/0607 257/780 |
| 7,888,259 | B2* | 2/2011 | Zbrzezny | .......... H01L 23/49816 438/612 |
| 9,761,549 | B2* | 9/2017 | Lin | ......................... H01L 24/11 |

* cited by examiner

*Primary Examiner* — Luan C Thai
(74) *Attorney, Agent, or Firm* — Robert Crownover (57) ABSTRACT

A vertically structured pad system and method can include: a platform having etch attributes, a platform top surface, and a platform side surface; a structure on the platform, the structure including a structure side surface extended up from the platform top surface terminating in a structure top surface, the structure including a structure interior surface defining a cavity within the structure, and the platform top surface exposed from within the cavity; and an interconnect structure adhered to the platform and the structure, the interconnect structure conforming with an exterior shape of the platform side surface in combination with the structure for locking the interconnect structure onto the platform and the structure.

20 Claims, 9 Drawing Sheets

VERTICALLY STRUCTURED PAD SYSTEM

CROSS-REFERENCE TO RELATED APPLICATION(S)

This claims priority benefit to all common subject matter of U.S. Provisional Patent Application No. 62/881,485 filed Aug. 1, 2019. The content of this application, in its entirety, is incorporated herein by reference.

TECHNICAL FIELD

This disclosure relates to electronic bonding pads, more particularly to solder bonding pads with vertically extended structures.

BACKGROUND

The rapidly growing market for portable electronics devices including cellular phones, laptop computers, and wearables, is an integral facet of modern life. These devices have unique attributes that have significant impacts on manufacturing and design in that they must be generally small, lightweight, and rich in functionality and they must be produced in high volumes at relatively low cost.

As an extension of the consumer electronics industry, the electronics packaging industry has witnessed ever-increasing commercial competitive pressures, along with growing consumer expectations and the diminishing opportunities for meaningful product differentiation in the marketplace. The advancement towards miniaturization has imposed constraints to the design of electronic components including interposers and printed circuit boards.

Many electronics packages will rely on electrical interconnections utilizing solder pads coupling to solder balls. The push for smaller solder pads is an ever-present design and manufacturing pressure. Reduction in the solder pad size arises in the context of many challenges including a reduced fatigue life of the solder joint together with an increased potential of electromigration failure.

There are a number of conventional solder pads for providing electrical interconnects. The previously developed solder pad can include a plated or un-plated conductive body having a substantially flat upper surface.

Solder balls coupled to the previously developed solder pad have a tendency to crack in a straight path following the surface of the previously developed solder pad and as a result exhibit a low shear strength. As the previously developed solder pad gets smaller the area of the pad decreases and the problem can worsen as the shear force required to crack the solder ball decreases.

As electronic packages evolve to incorporate more and smaller components the pressure to push the technological envelope becomes increasingly challenging. More significantly, with the ever-decreasing sizes of the solder pads, the risks of process faults like solder ball misalignments increases greatly.

In view of the ever-increasing commercial competitive pressures, along with growing consumer expectations and the diminishing opportunities for meaningful product differentiation in the marketplace, it is critical that answers be found for these problems. Thus, a need remains for solder pads that can be miniaturized while providing enhanced shear strength and solder ball alignment. Solutions to these problems have been long sought but prior developments have not taught or suggested any solutions and, thus, solutions to these problems have long eluded those skilled in the art.

BRIEF DESCRIPTION OF THE DRAWINGS

The pad system is illustrated in the figures of the accompanying drawings which are meant to be exemplary and not limiting, in which like reference numerals are intended to refer to like components, and in which.

DETAILED DESCRIPTION

In the following description, reference is made to the accompanying drawings that form a part hereof, and in which are shown by way of illustration, embodiments in which the pad system may be practiced. It is to be understood that other embodiments may be utilized and structural changes may be made without departing from the scope of the pad system.

When features, aspects, or embodiments of the pad system are described in terms of steps of a process, an operation, a control flow, or a flow chart, it is to be understood that the steps can be combined, performed in a different order, deleted, or include additional steps without departing from the pad system as described herein.

The pad system is described in sufficient detail to enable those skilled in the art to make and use the pad system and provide numerous specific details to give a thorough understanding of the pad system; however, it will be apparent that the pad system may be practiced without these specific details.

In order to avoid obscuring the pad system, some well-known system configurations and descriptions are not disclosed in detail. Likewise, the drawings showing embodiments of the system are semi-diagrammatic and not to scale and, particularly, some of the dimensions are for the clarity of presentation and are shown greatly exaggerated in the drawing FIGs.

As used herein, the term system is defined as a device or method depending on the context in which it is used. For expository purposes, the term "horizontal" as used herein is defined as a plane parallel to the top plane or surface of the platform, regardless of its orientation. The term "vertical" refers to a direction perpendicular to the horizontal as just defined. Terms, such as "above", "below", "bottom", "top", "side", "higher", "lower", "upper", "over", and "under", are defined with respect to the horizontal plane. As used herein the term "couple" as in coupling or coupled, means a physical connection, whether direct or indirect.

Figure 1:
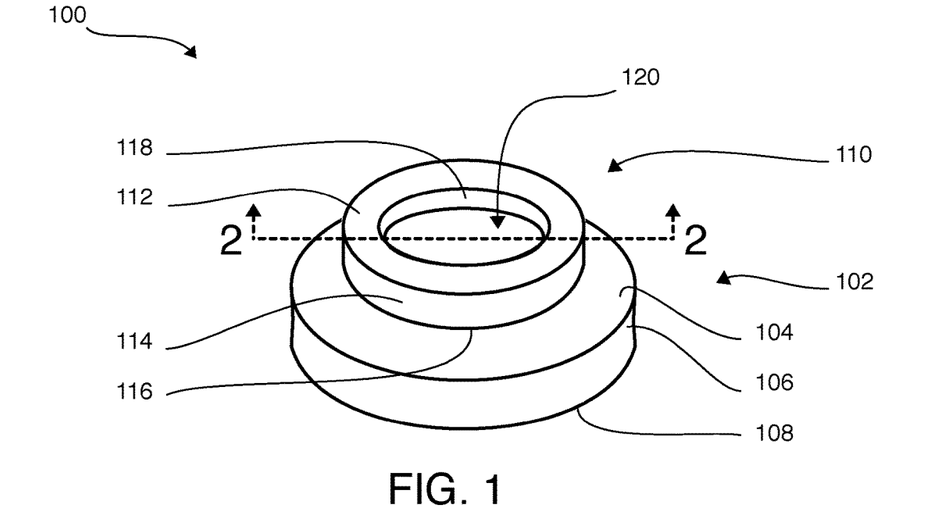
FIG. 1 is an isometric view of the pad system in a first embodiment.

Referring now to FIG. 1, therein is shown an isometric view of the pad system 100 in a first embodiment. The pad system 100 is shown having a platform 102.

The platform 102 can be a conductive metal such as copper or a metallic alloy. It is further contemplated, for example, that the platform 102 could be formed of a core substrate material covered by conductive layers, which would thereby form an electrically conductive platform 102.

The platform 102 can be formed with a platform top surface 104, a platform side surface 106, and a platform bottom surface 108. The platform top surface 104 and the platform bottom surface 108 are depicted as substantially horizontal and parallel to each other.

The platform side surface 106 can extend vertically between the platform bottom surface 108 and the platform top surface 104. As shown, the platform side surface 106 can be formed through isotropic etching, resulting in the platform side surface 106 having a concave shape. The concave shape has been discovered to enhance bonding between the platform side surface 106 of the platform 102 and a non-solder mass defined interconnect, such as the interconnect structure 1002 of FIG. 10. The platform side surface 106 can extend up vertically from the platform bottom surface 108 to terminate at the platform top surface 104.

The platform top surface 104 is depicted having a structure 110 formed vertically extending therefrom. The structure 110 can be a conductive metal such as copper or a metallic alloy. It is further contemplated, for example, that the structure 110 could be formed of a core substrate material covered by conductive layers, which would thereby form an electrically conductive structure 110.

The structure 110 and the platform 102 can be integrally formed as a single solid structure. Alternatively, the structure 110 and the platform 102 can be formed as a composite structure comprising an individually formed structure 110 and an individually formed platform 102.

The structure 110 can be formed with a structure top surface 112, a structure side surface 114, and a structure bottom surface 116. The platform top surface 104 can be in direct contact with the structure bottom surface 116. The structure top surface 112 and the structure bottom surface 116 are depicted as substantially horizontal and parallel to each other, along with the platform top surface 104 and the platform bottom surface 108.

The structure side surface 114 can extend vertically between the structure bottom surface 116 and the structure top surface 112. The structure side surface 114 can extend up vertically from the structure bottom surface 116 and the platform top surface 104 to terminate at the structure top surface 112.

The structure 110 can further include a structure interior surface 118 encircling and defining a cavity 120. The structure interior surface 118 can extend from the structure bottom surface 116 vertically toward the structure top surface 112 and can be parallel to the structure side surface 114.

The platform top surface 104 can be exposed from within the structure 110, that is from within the cavity 120 of the structure 110. The platform top surface 104 can be bordered and in direct contact with the structure interior surface 118.

Figure 2:
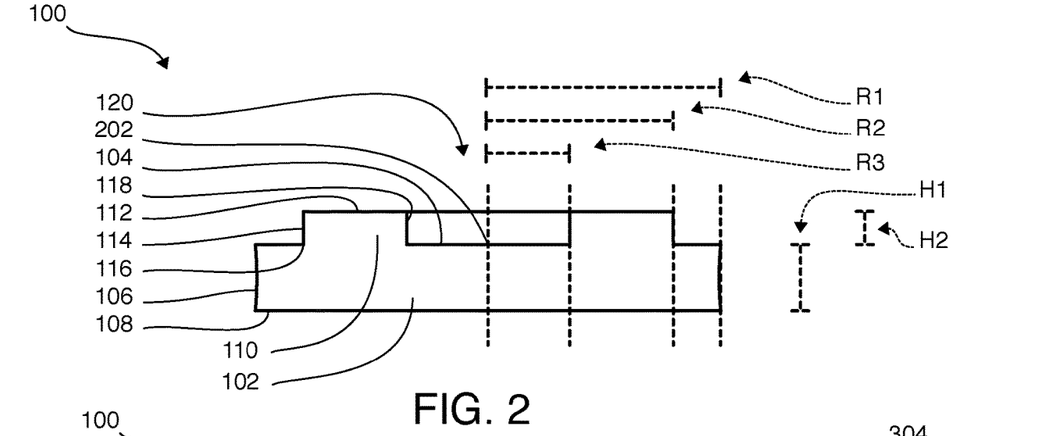
FIG. 2 is a cross-sectional view of the pad system along the line 2-2 of FIG. 1.

Referring now to FIG. 2, therein is shown a cross-sectional view of the pad system 100 along the line 2-2 of FIG. 1. The pad system 100 is shown having the platform 102 with a height H1.

That is, height H1 can be the length of the platform side surface 106 in other implementations with vertical platform side surfaces. Further, height H1 can be the distance between the platform top surface 104 and the platform bottom surface 108, whether the platform side surface 106 is vertical or not.

The pad system 100 is further depicted having the structure 110 extending vertically from the platform 102. The structure bottom surface 116 is depicted in direct contact with the platform top surface 104.

The structure 110 can have a height H2. The height H2 can be the length of the structure side surface 114 in implementations with structure side surfaces. Further, height H2 can be the distance between the structure bottom surface 116 and the structure top surface 112, whether the structure side surface 114 is vertical or not.

The structure 110 is shown to bound the cavity 120. The cavity 120, the structure 110, and the platform 102 can have a center 202. The center 202 can be calculated as the centroid or geometric center of the element from the top view.

For example, the center 202 can be a vertical axis extending through the platform 102, the cavity 120, and the structure 110 at a horizontal center of the respective element. The center 202 is shown extending through the platform 102, the structure 110, and the cavity 120; however, it is contemplated that these structures could be offset from one another and therefore have centers unique to each element.

The platform 102 is depicted having a radius R1 extending from the center 202 to the farthest platform side surface 106. The platform 102 is depicted as circular for descriptive clarity only, and in contemplated implementations where geometric shapes other than circles are used, radius R1 can be understood to be the distance from the center 202 to the farthest platform side surface 106. Yet further, platform side surface 106 can be formed through isotropic etching resulting in the platform side surface 106 having a concave shape as shown. R1 can be understood to be the distance from the center 202 to the farthest curved part the platform side surface 106.

The structure 110 is depicted having a radius R2 extending from the center 202 to the structure side surface 114. The structure 110 is depicted as circular for descriptive clarity only, and in contemplated implementations where geometric shapes other than circles are used, radius R2 can be understood to be the distance from the center 202 to the farthest structure side surface 114.

The cavity 120 is depicted having a radius R3 extending from the center 202 to the structure interior surface 118. The cavity 120 is depicted as circular for descriptive clarity only, and in contemplated implementations where geometric shapes other than circles are used, radius R3 can be understood to be the distance from the center 202 to the farthest structure interior surface 118.

Previously developed solder pads will have an area described by equation 1:

$$A1 = \Pi R1^2 + 2\Pi R1 H1 \qquad \text{equation 1}$$

where R1 and H1 refer to analogous dimensions within previously developed solder pads.

The area of the pad system 100 of FIG. 1 can be described by equation 2:

$$A2 = \Pi R1^2 + 2\Pi R1 H1 + 2\Pi R2 H2 + 2\Pi R3 H2 \qquad \text{equation 2}$$

As will be appreciated, the percentage of area increase between the previously developed solder pads and the pad system 100 can be described by equation 3:

$$\text{Percentage area increase} = 100 \times (A2 - A1)/A1 \qquad \text{equation 3}$$

Illustratively, for example, when a solder pad, such as a previously developed solder pad or the platform 102 have a diameter of 0.33 mm, the percentage area increase will be 15.8%; where R1=0.165 mm; R2=0.125 mm; R3=0.065 mm; H1=0.027 mm; and H2=0.015 mm. The area of the previously developed solder pads is 0.114 mm$^2$ while the area of the pad system 100 is 0.132 mm$^2$ which provides the 15.8% increase in area.

As a further illustrative example, when a solder pad, such as a previously developed solder pad or the platform 102 have a diameter of 0.25 mm, the percentage area increase will be 18.6%; where R1=0.125 mm; R2=0.095 mm; R3=0.045 mm; H1=0.027 mm; and H2=0.015 mm. The area of the previously developed solder pads is 0.07 mm$^2$ while the area of the pad system 100 is 0.083 mm$^2$ which provides the 18.6% increase in area.

As yet a further illustrative example, when a solder pad, such as a previously developed solder pad or the platform 102 have a diameter of 0.15 mm, the percentage area increase will be 28.7%; where R1=0.075 mm; R2=0.055 mm; R3=0.025 mm; H1=0.027 mm; and H2=0.015 mm. The area of the previously developed solder pads is 0.0261 mm$^2$ while the area of the pad system 100 is 0.0336 mm$^2$ which provides the 28.7% increase in area.

It has been discovered that the increase in the area, between a previously developed solder pad and the pad system 100, together with the varying geometries, of the structure 110 in relation to the platform 102, provide an unexpectedly large increase in the shear force required to crack an interconnect structure adhered thereto. That is, the shear force required to crack an interconnect structure, such as a solder ball attached to the pad system 100, is greater than would be expected by the increase in area alone.

The increase in area provides a larger area for intermetallic compound formation at the solder pad system 100 interface, hence increasing the solder joint tensile and shear strength. The interconnect structure 1002 of FIG. 10, for example, can adhere and connect to the structure 110 providing a greater resistance to the tensile and shear force.

Based on a simple shear stress equation, $\tau = F/A$, where F and A is the shear force and the cross-sectional area, respectively. Shear stress is proportional to the shear force and inversely proportional to the cross-sectional area.

Figure 10:
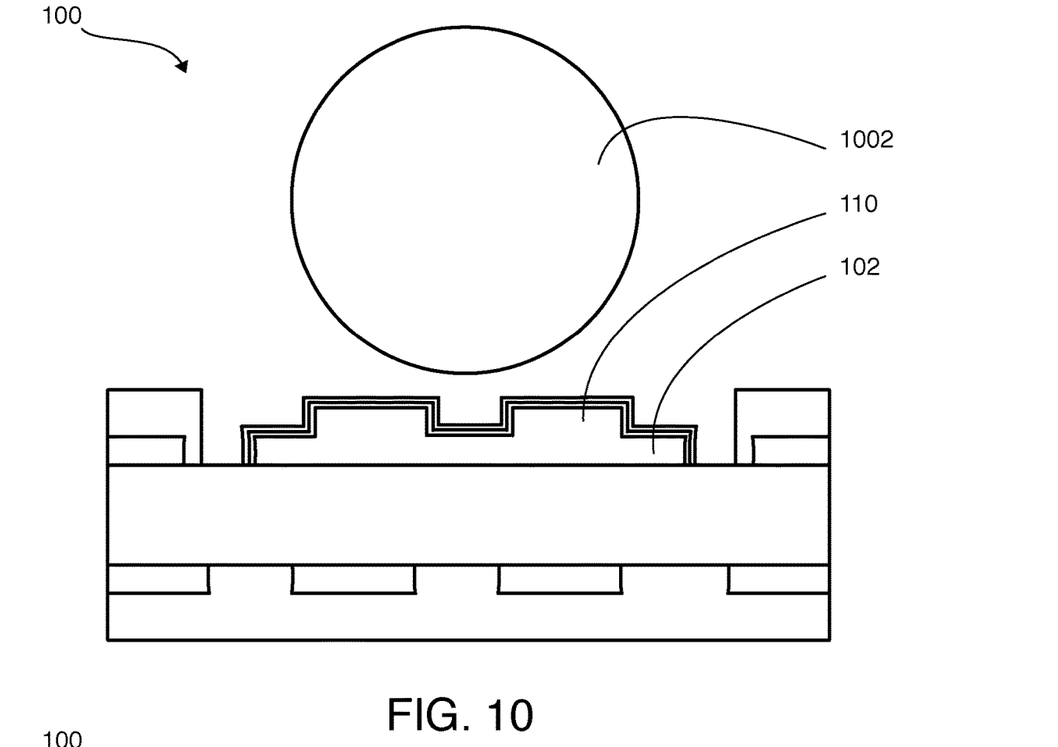
FIG. 10 is the pad system of FIG. 3 during an interconnect structure mount phase of manufacture.

A solder joint shear test can quantify and compare the shear strength of a solder ball on a previously developed solder pad and the interconnect structure 1002 on the pad system 100. For the previously developed solder pad, any crack resulting from a shearing force within a solder ball coupled thereto, will propagate through the brittle intermetallic compound along the flat surface of the previously developed solder pad.

However, in the case of the pad system 100, the structure 110 forms an obstruction to any crack propagation path within the interconnect structure 1002 coupled thereto. A crack would need to propagate a longer path, and upwards or around the structure 110 before failure. A larger shear force is therefore required to separate the interconnect structure 1002 from the pad system 100.

The advancement towards miniaturization has imposed design constraints for interposers and PCBs. Smaller pad specification requirements have become expected and are expected to continue into the future.

This expected reduction in the pad size requirements will operate to reduce the fatigue life of the interconnect structure and simultaneously increase the potential of electromigration failure. However, the pad system 100 is designed to counter these effects and improve solder ball reliability. The percentage increase in the contact surface area is more significant for smaller pad size for a constant thickness of the structure 110.

Additionally, the pad system 100 can aid in the interconnect structure 1002 alignment accuracy as it serves like a crater for the interconnect structure 1002 to fit in. This secures the interconnect structure 1002 in position during reflow and minimizes skewing.

Figure 3:
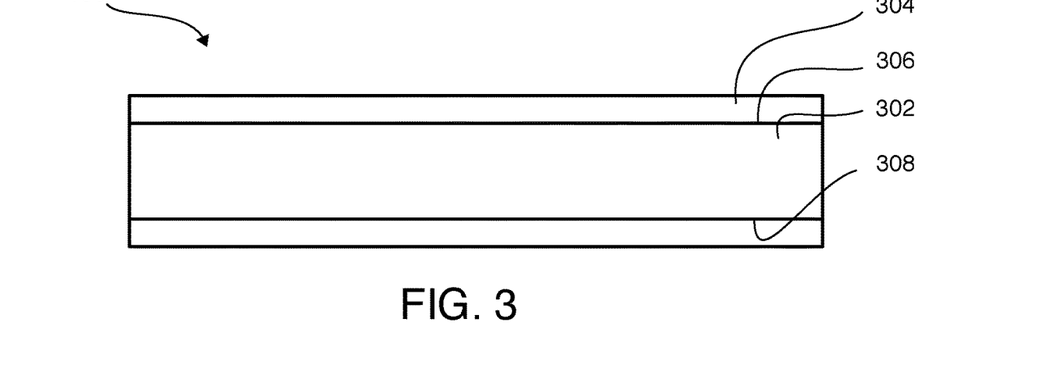
FIG. 3 is the pad system of FIG. 1 after a core substrate plating phase of manufacture for a first manufacturing embodiment.

Referring now to FIG. 3, therein is shown the pad system 100 of FIG. 1 after a core substrate plating phase of manufacture for a first manufacturing embodiment. The core substrate plating phase can illustratively depict a core substrate 302 having a conductive layer 304 formed thereon. The core substrate 302 can be a substrate for supporting and for connecting the pad system 100 with other components, such as passive or active components, coupled to the core substrate 302. The core substrate 302 can be a printed circuit board substrate or a semiconductor substrate.

The conductive layer 304 can be a metallic layer such as a copper layer. Alternatively, it is contemplated that the conductive layer 304 could be another conductive material capable of being joined to the interconnect structure 1002, for example of FIG. 10.

The conductive layer 304 could be formed on both a core top surface 306 as well as a core bottom surface 308. It is contemplated that in some implementations, without the surface plating phase of manufacture, the result of which is depicted for example in FIG. 9, the top surface 306 can form the platform top surface 104 of FIG. 1.

Figure 4:
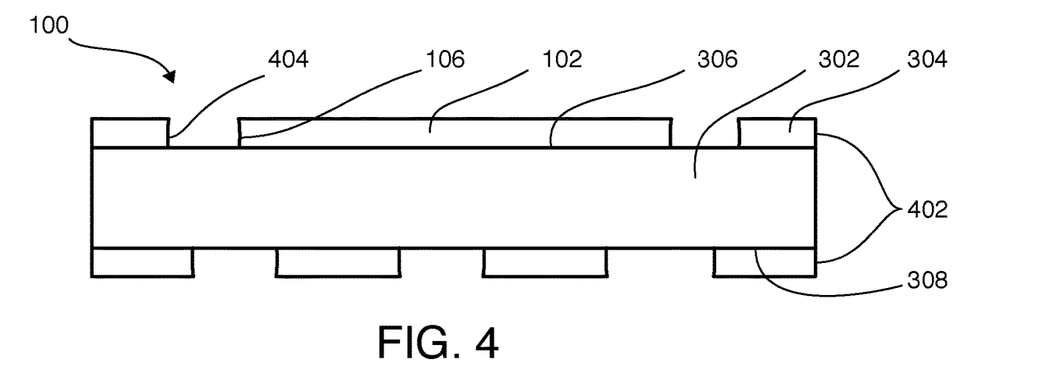
FIG. 4 is the pad system of FIG. 3 after a first etching phase of manufacture.

Referring now to FIG. 4, therein is shown the pad system 100 of FIG. 3 after a first etching phase of manufacture. The pad system 100 can depict a post etching phase of manufacture together with a post resist stripping phase of manufacture. However, for clarity of description these well-known process steps are not described in detail.

The conductive layer 304 formed on the top surface 306 of the core substrate 302, can be seen to form the initial structures of the platform 102 of FIG. 1. The conductive layer 304 on either side of the platform 102 or formed on the core bottom surface 308 can provide interconnections 402 for power and data from components and connections at other locations along the core substrate 302.

The platform 102 is depicted having the platform side surface 106 together with side surfaces 404 of the interconnections 402 formed through isotropic etching. As shown, isotropic etching results in the platform side surface 106 and the side surfaces 404 of the interconnections 402 having a concave shape.

Figure 5:
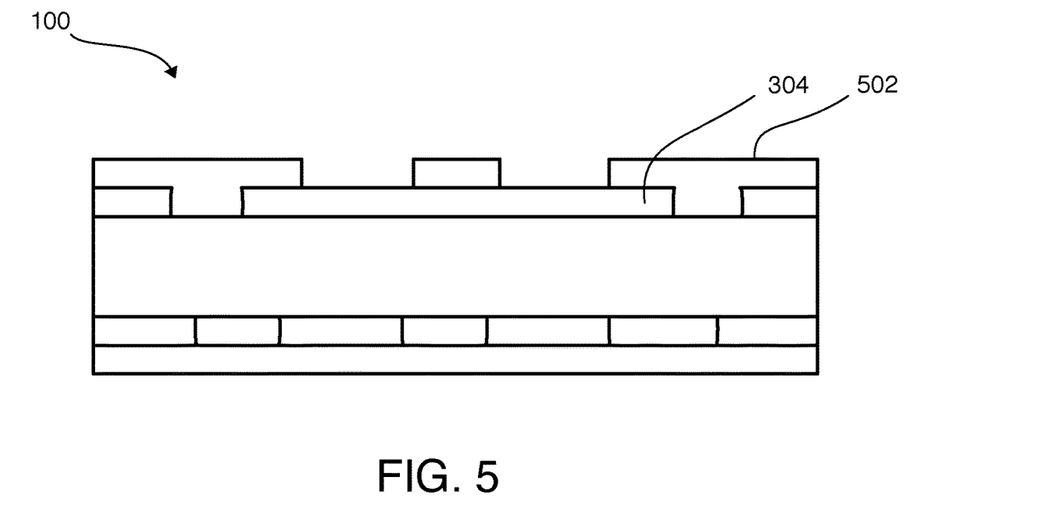
FIG. 5 is the pad system of FIG. 3 after a dry film lamination and develop phase of manufacture.

Referring now to FIG. 5, therein is shown the pad system 100 of FIG. 3 after a dry film lamination and develop phase of manufacture. The conductive layer 304 is depicted having a dry film lamination 502 formed thereon.

The dry film lamination 502 can be a photosensitive polymer film. The dry film lamination 502 can include recesses where the structure 110 of FIG. 1 will be formed on the conductive layer 304.

Figure 6:
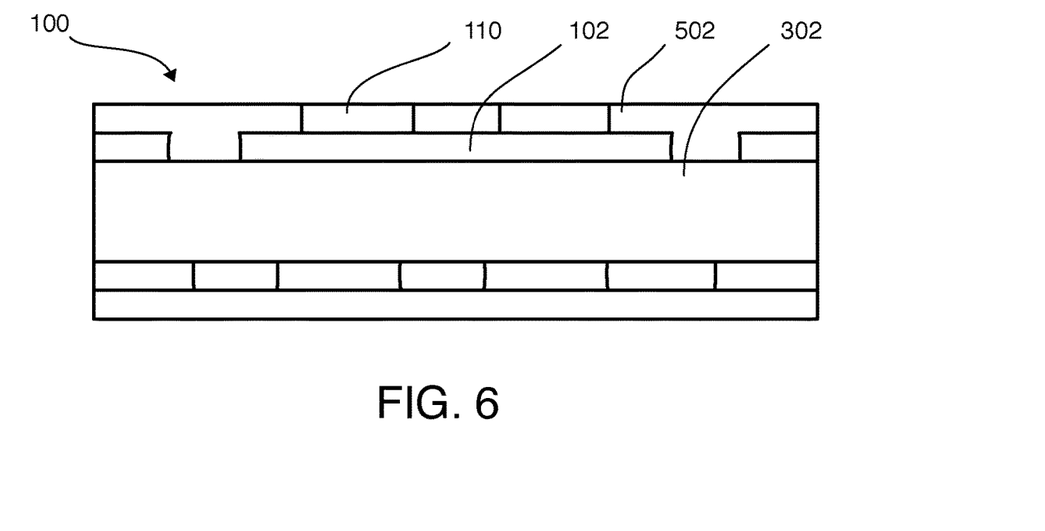
FIG. 6 is the pad system of FIG. 3 after a plating phase of manufacture.

Referring now to FIG. 6, therein is shown the pad system 100 of FIG. 3 after a plating phase of manufacture. The pad system 100 is shown having the structure 110 formed on the platform 102 and extending upward from the platform 102 away from the core substrate 302. The structure 110 can be formed within the recesses of the dry film lamination 502 and can include a deposition seam where the structure 110 contacts the platform 102 resulting from the deposition of the structure 110 onto the platform 102.

Figure 7:
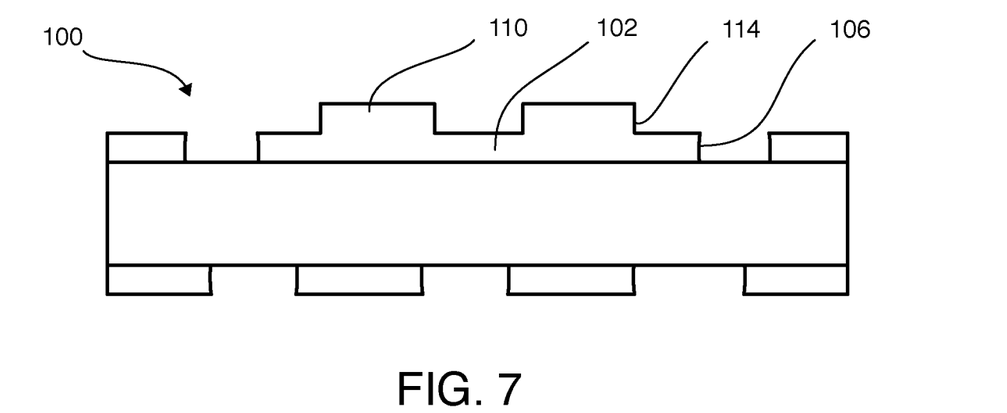
FIG. 7 is the pad system of FIG. 3 after a stripping phase of manufacture.

Referring now to FIG. 7, therein is shown the pad system 100 of FIG. 3 after a stripping phase of manufacture. The pad system 100 is shown having the dry film lamination 502 of FIG. 5 removed. The pad system 100 is further shown having the structure 110 remaining on the platform 102 after the dry film lamination 502 is removed. The structure 110 is shown having the structure side surface 114 largely straight due to the plating formation process. Unlike the structure side surface 114, the platform side surface 106 is depicted to be formed through isotropic etching which results in the platform side surface 106 having a concave shape.

Figure 8:
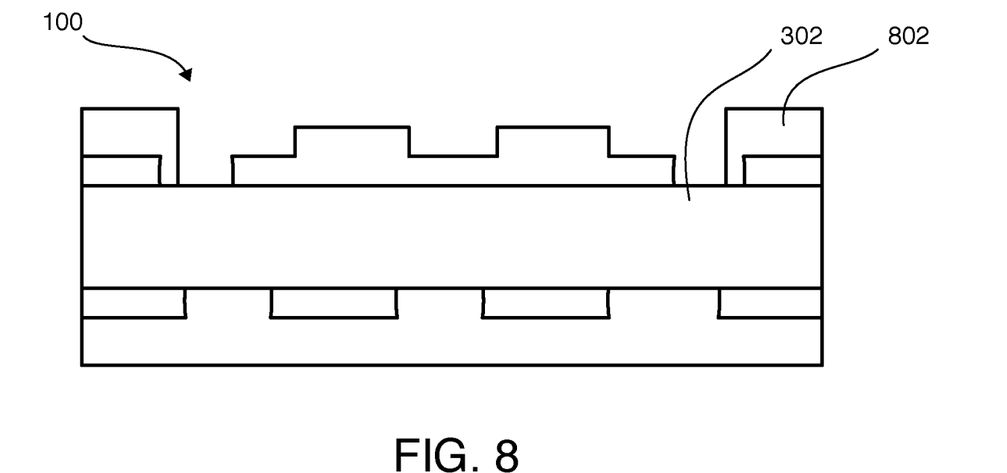
FIG. 8 is the pad system of FIG. 3 after a resist cure phase of manufacture.

Referring now to FIG. 8, therein is shown the pad system 100 of FIG. 3 after a resist cure phase of manufacture. The pad system 100 is depicted having a solder resist 802.

The solder resist 802 can be a solder mask or a solder resist. The solder resist 802 can protect against oxidation and can further prevent solder bridges from shorting closely spaced solder pads. The solder resist 802 can further be formed over the interconnects formed below the core substrate 302.

Figure 9:
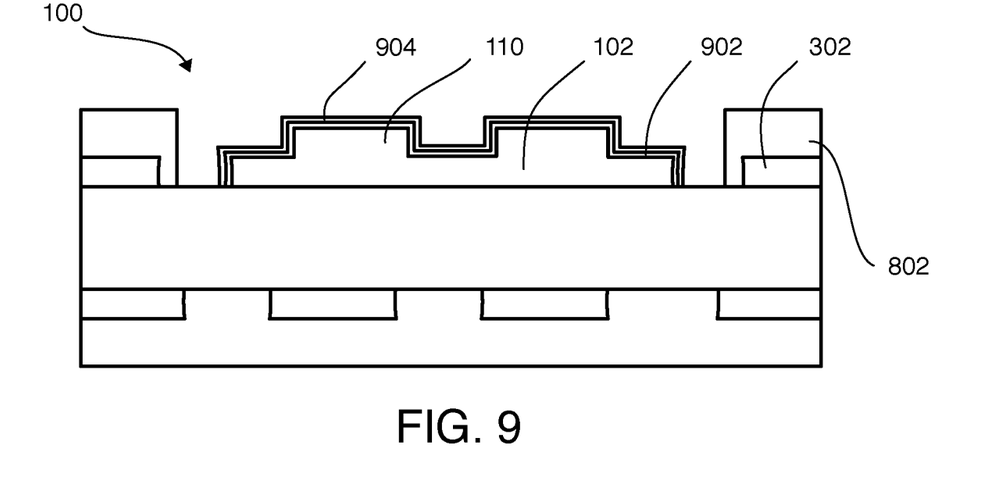
FIG. 9 is the pad system of FIG. 3 after a surface plating phase of manufacture.

Referring now to FIG. 9, therein is shown the pad system 100 of FIG. 3 after a surface plating phase of manufacture. The pad system 100 can be shown having conductive coatings plated on the platform 102 and the structure 110. The conductive coatings can be deposited, plated, or otherwise formed as one or more electrically conductive layers of an electrically conductive material.

Illustratively, for example, the conductive coating on the platform 102 and the structure 110 can be a first conductive coating 902 and a second conductive coating 904. The first conductive coating 902 in direct contact with the conductive layer 304 of FIG. 3.

The conductive coatings are contemplated to provide increased surface adhesion for the interconnect structure 1002 of FIG. 10 to be formed thereon. As such, the conductive coatings are contemplated to include nickel-gold layers, metal alloy layers, nickel-palladium-gold layers, Organic Surface Protectant layers, among others.

The first conductive coating 902 can be formed on the platform 102 and the structure 110. Above the first conductive coating 902, the second conductive coating 904 can be formed.

Both the first conductive coating 902 and the second conductive coating 904 are depicted as lower than a top layer of the solder resist 802 surrounding the platform 102. The first conductive coating 902 as well as the second conductive coating 904 are contemplated to be an optional implementation and the pad system 100 can be practiced without these specific layers.

Referring now to FIG. 10, therein is shown the pad system 100 of FIG. 3 during an interconnect structure mount phase of manufacture. The interconnect structure 1002 can be a solder ball interconnect and is shown being aligned with the platform 102 and the structure 110.

Examples of an electrically conductive structure that may comprise the interconnect structure includes but is not limited to a ball interconnect, a solder ball, a pillar with a solder cap, and a copper pillar with solder cap, just to name a few. The first conductive coating 902 and the second conductive coating 904 are shown to follow and conform to the concave curvature of the platform side surface 106 of the etched platform 102.

The first conductive coating 902 and the second conductive coating 904 are shown to follow and conform to the straighter lines of the structure 110. It has been discovered that the concave shape of the platform side surface 106 enhances bonding between the platform side surface 106—including the first conductive coating 902 and the second conductive coating 904—and the interconnect structure 1002.

Figure 11:
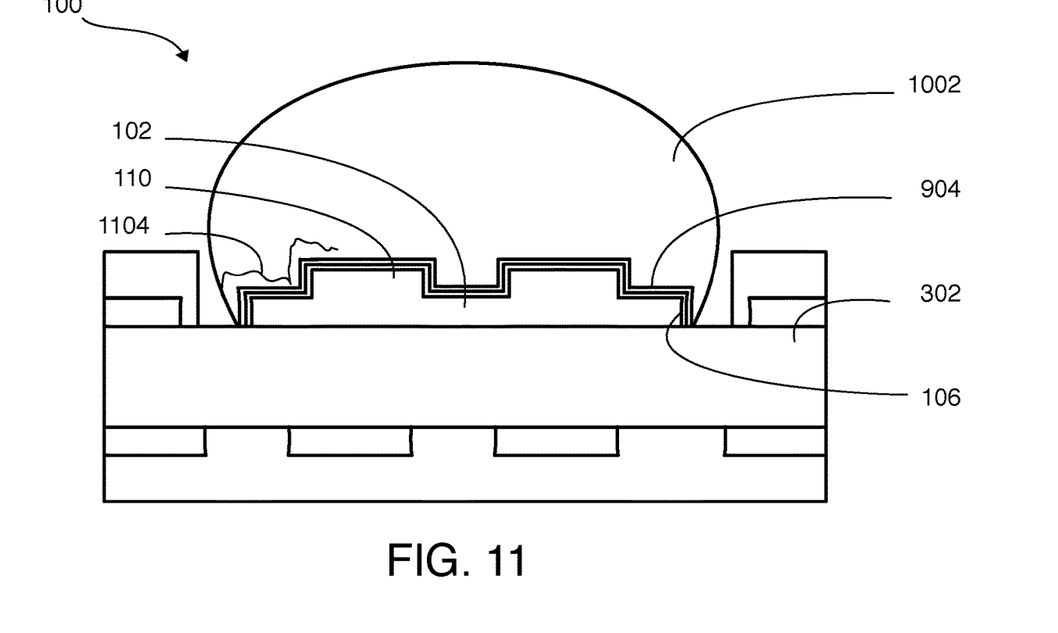
FIG. 11 is the pad system of FIG. 3 after a reflow phase of manufacture.

Referring now to FIG. 11, therein is shown the pad system 100 of FIG. 3 after a reflow phase of manufacture. The interconnect structure 1002 can be formed as a non-solder mask defined interconnect structure in direct contact with the second conductive coating 904 and extend fully over the pad system 100 to contact the core substrate 302 peripheral to the pad system 100.

As the interconnect structure 1002 is attached to the pad system 100, an intermetallic compound can be formed within the interconnect structure 1002 very close to the second conductive coating 904 and can be formed by alloying between the interconnect structure 1002 and the second conductive coating 904.

In implementations where the second conductive coating 904 or the first conductive coating 902 of FIG. 9 are not used, the intermetallic layer can be formed in direct contact with the platform 102 and the structure 110.

As will be appreciated, the interconnect structure 1002 can be adhered to the platform 102 and the structure 110 and conform with an exterior shape of the platform 102 in combination with the structure 110. The conformal structure of the interconnect structure 1002 can operate to lock the interconnect structure 1002 onto the platform 102 and the structure 110; locking the interconnect structure 1002 onto the platform 102 and the structure 110 increases the strength of the mechanical connection of the interconnect structure 1002 between both the platform 102 and the structure 110.

As shown, the platform side surface 106, formed through isotropic etching, results in the platform side surface 106 having a concave shape. It has been discovered that surface etch attributes, such as the concave shape, provide increased surface area, outward inclining angles, and overhangs, which greatly enhance sheer strength between the platform 102 and the interconnect structure 1002.

The intermetallic layer is generally the place within the interconnect structure 1002 where cracks 1104 are known to form. As is depicted, the crack 1104 can extend horizontally along the path of the platform 102.

Once the crack 1104 encounters the structure 110, the crack 1104 is forced to change direction and continue forming vertically to get around the structure 110. It has been discovered that forcing the crack 1104 to form in a distinctly different direction increases the shear force the interconnect structure 1002 is able to absorb before failing. Also, since the crack 1104 forms within the intermetallic layer, the crack 1104 can trace the border of structure 110 coupled to the platform 102, which includes additional directional changes that the crack 1104 can make as it propagates through the interconnect structure 1002 within the intermetallic layer.

Importantly, it has been discovered that the increased shear force which the interconnect structure 1002 can tolerate can meet future stress requirements for solder ball connections. The need for increased shear force characteristics arises based on previously developed solder pads having a flat surface allowing cracks to form easily, commonly leading to premature failure of the connection.

As will be appreciated, the structure 110 also improves alignment of the interconnect structure 1002 when being attached to the pad system 100. This results from the interconnect structure 1002 first contacting and wetting the structure 110 before contacting other elements.

Figure 12:
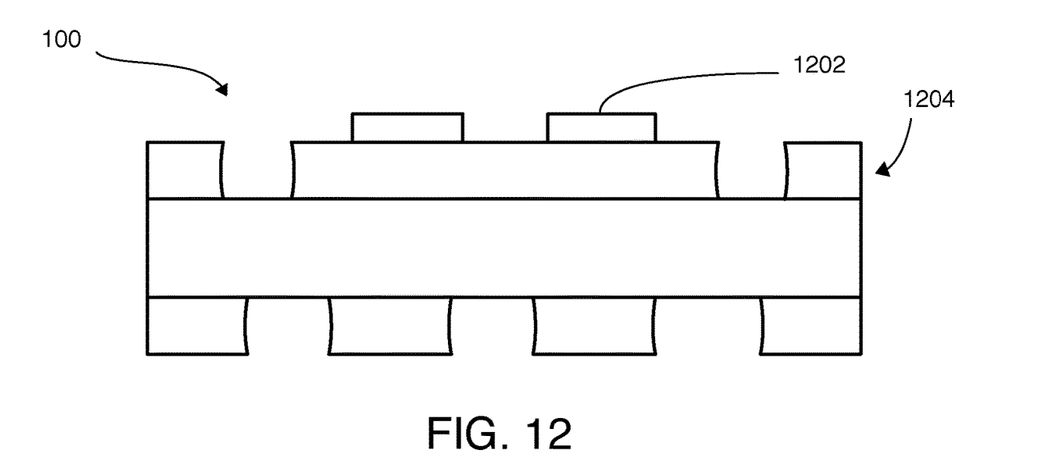
FIG. 12 is the pad system of FIG. 1 after a dry film lamination and develop phase of manufacture for a second manufacturing embodiment.

Referring now to FIG. 12, therein is shown the pad system 100 of FIG. 1 after a dry film lamination and develop phase of manufacture for a second manufacturing embodiment. The pad system 100 can be depicted including a dry film lamination 1202 selectively formed above a conductive layer 1204.

The conductive layer 1204 can be formed to have the dimensions of the platform 102 of FIG. 1. The dry film lamination 1202 can be similar to the dry film lamination 502 of FIG. 5. However, unlike the dry film lamination 502 which created voids for forming the structure 110 of FIG. 1, the dry film lamination 1202 can expose areas of the conductive layer 1204 to an etch for forming the structure 110.

Figure 13:
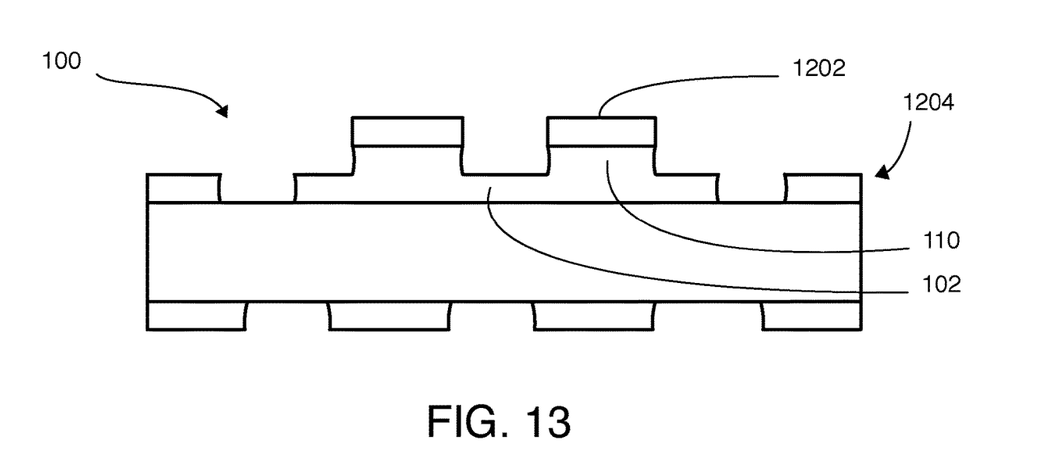
FIG. 13 is the pad system of FIG. 12 after an etching phase of manufacture.

Referring now to FIG. 13, therein is shown the pad system 100 of FIG. 12 after an etching phase of manufacture. The pad system 100 is shown having the structure 110 and the platform 102 formed from the conductive layer 1204.

Further, every area of the conductive layer 1204 not covered by the dry film lamination 1202 of FIG. 12 can be depicted as being etched. Illustratively, for example, the structure side surface 114 of FIG. 1, the structure interior surface 118 of FIG. 1, and the cavity 120 of FIG. 1 can include surface etch attributes. The etch attributes can be surface textures, surface geometries, and other surface attributes arising from etching a single conductive layer including both the platform 102 and the structure 110. Illustratively, for example, surface etch attributes can include increased surface area, outward inclining angles, and overhangs, which greatly enhance sheer strength between the platform 102 and the interconnect structure 1002 of FIG. 10, as well as between the structure 110 and the interconnect structure 1002.

Figure 14:
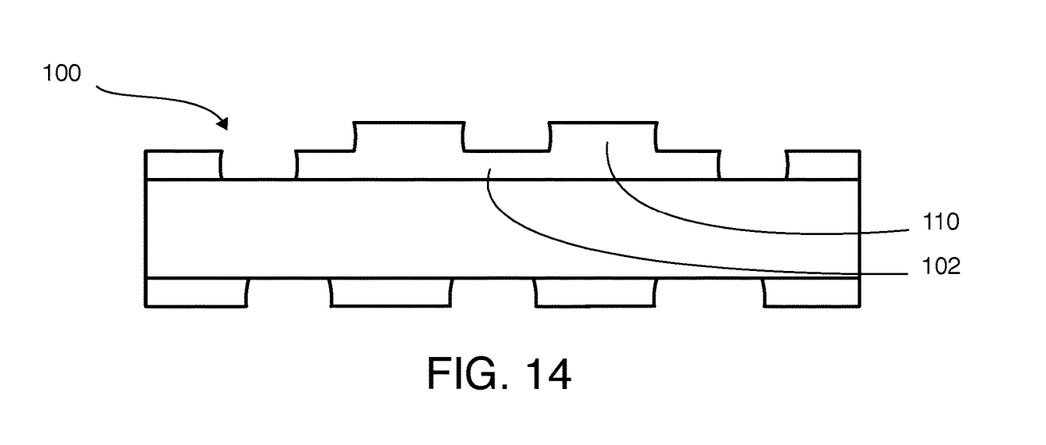
FIG. 14 is the pad system of FIG. 12 after a stripping phase of manufacture.

Referring now to FIG. 14, therein is shown the pad system 100 of FIG. 12 after a stripping phase of manufacture. The pad system 100 is shown having the dry film lamination 1202 of FIG. 12 removed from over the structure 110.

The pad system 100 is shown in an alternative implementation having the platform 102 and the structure 110 without additional plated layers formed thereover. That is, the conductive layer 1204 of FIG. 12 will be directly exposed to the interconnect structure 1002 of FIG. 10.

Figure 15:
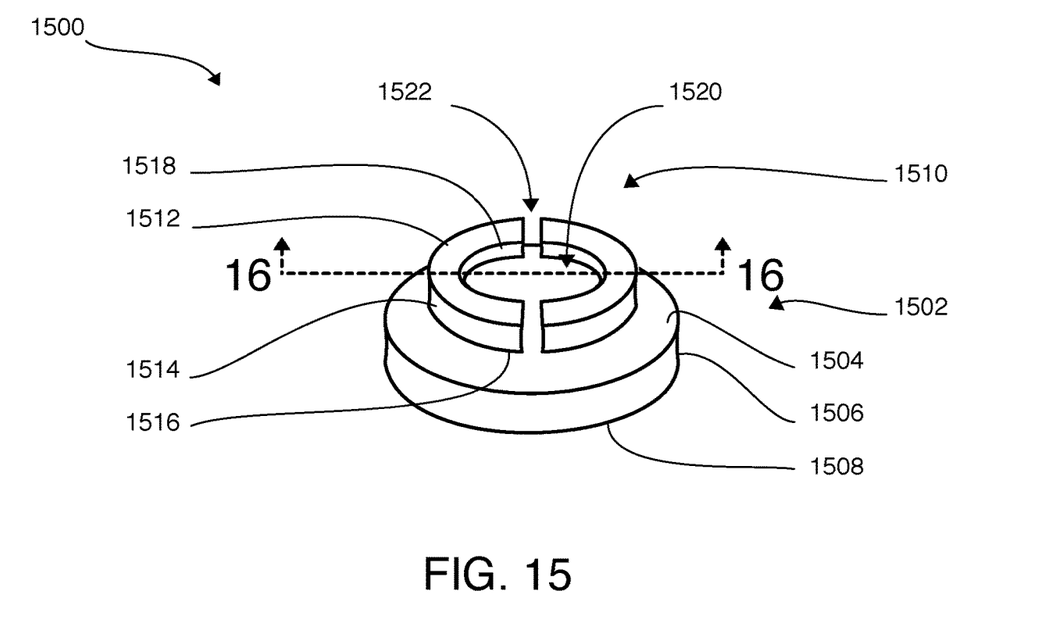
FIG. 15 is an isometric view of the pad system in a second embodiment.

Referring now to FIG. 15, therein is shown an isometric view of the pad system 1500 in a second embodiment. The pad system 1500 is shown having a platform 1502.

The platform 1502 can be a conductive metal such as copper or a metallic alloy. It is further contemplated, for example, that the platform 1502 could be formed of a core material covered by conductive layers, which would thereby form an electrically conductive platform 1502.

The platform 1502 can be formed with a platform top surface 1504, a platform side surface 1506, and a platform bottom surface 1508. The platform top surface 1504 and the platform bottom surface 1508 are depicted as substantially horizontal and parallel to each other.

The platform side surface 1506 can extend vertically between the platform bottom surface 1508 and the platform top surface 1504. The platform side surface 1506 can extend up vertically from the platform bottom surface 1508 to terminate at the platform top surface 1504.

The platform top surface 1504 is depicted having a structure 1510 formed vertically extending therefrom. The structure 1510 can be a conductive metal such as copper or a metallic alloy. It is further contemplated, for example, that the structure 1510 could be formed of a core material covered by conductive layers, which would thereby form an electrically conductive structure 1510.

The structure 1510 and the platform 1502 can be integrally formed as a single solid structure. Alternatively, the structure 1510 and the platform 1502 can be formed as a composite structure comprising an individually formed structure 1510 and an individually formed platform 1502.

The structure 1510 can be formed with a structure top surface 1512, a structure side surface 1514, and a structure bottom surface 1516. The platform top surface 1504 can be in direct contact with the structure bottom surface 1516. The structure top surface 1512 and the structure bottom surface 1516 are depicted as substantially horizontal and parallel to each other, along with the platform top surface 1504 and the platform bottom surface 1508.

The structure side surface 1514 can extend vertically between the structure bottom surface 1516 and the structure top surface 1512. The structure side surface 1514 can extend up vertically from the structure bottom surface 1516 and the platform top surface 1504 to terminate at the structure top surface 1512.

The structure 1510 can further include a structure interior surface 1518 encircling and defining a cavity 1520. The structure interior surface 1518 can extend from the structure bottom surface 1516 vertically toward the structure top surface 1512 and can be parallel to the structure side surface 1514.

The platform top surface 1504 can be exposed from within the structure 1510, that is from within the cavity 1520 of the structure 1510. The platform top surface 1504 can be bordered and in direct contact with the structure interior surface 1518.

The structure 1510 is further shown to have a channel 1522 extending from the structure side surface 1514 through the structure 1510 to the structure interior surface 1518. The channel 1522 can extend through the structure 1510 so as to horizontally expose the cavity 1520 of the structure 1510 through the structure 1510.

It has been discovered that the channel 1522 can allow air and gasses to escape during the interconnect structure joining process. This can further increase the shear strength of an interconnect structure coupled to the pad system 1500 by producing a more uniform intermetallic layer.

As shown, the platform side surface 1506, the structure side surface 1514, and the structure interior surface 1518 can be formed through isotropic etching. Isotropic etching results in the platform side surface 1506, the structure side surface 1514, and the structure interior surface 1518 having a concave shape. It has been discovered that surface etch attributes, including the concave shape, provide increased surface area, outward inclining angles, and overhangs, which greatly enhance sheer strength between the platform 1502 and the interconnect structure 1602 of FIG. 16, as well as between the structure 1510 and the interconnect structure 1602.

Figure 16:
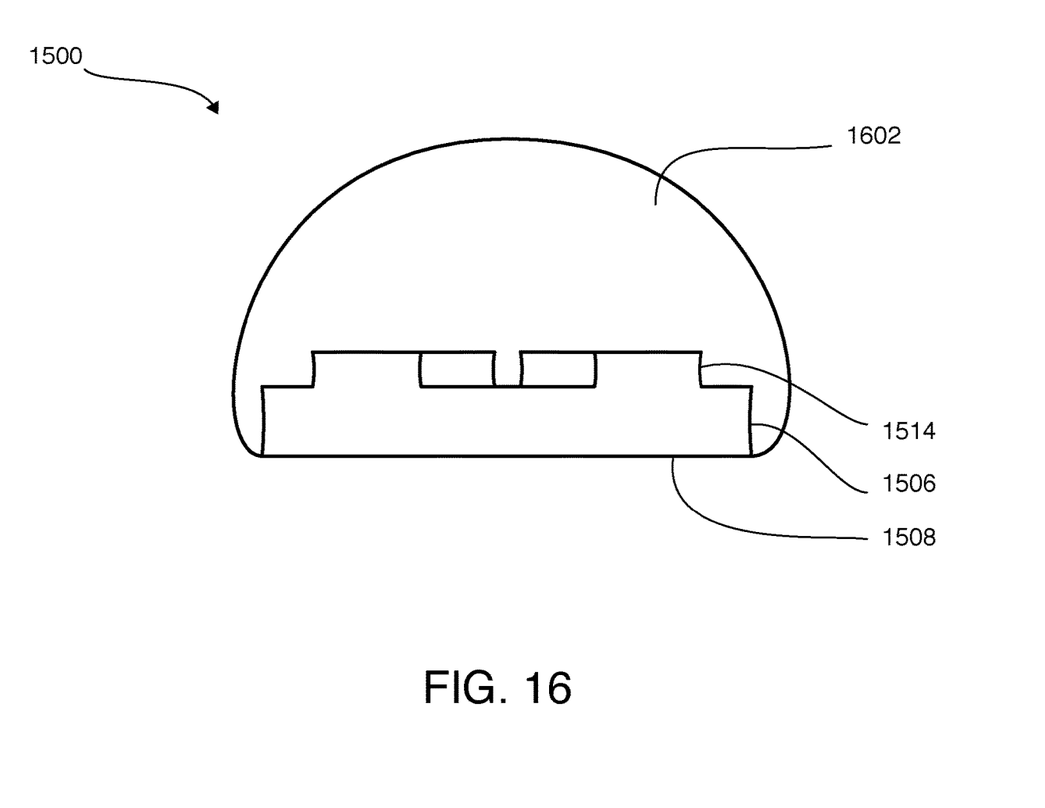
FIG. 16 is a cross-sectional view of the pad system along the line 16-16 of FIG. 15.

Referring now to FIG. 16, therein is shown a cross-sectional view of the pad system 1500 along the line 16-16 of FIG. 15. The pad system 1500 is shown bonded to a non-solder mask defined interconnect such as an interconnect structure 1602. The non-solder mask defined interconnect can provide much better adhesion, than traditional mask defined interconnects, because the interconnect structure 1602 can directly contact the platform side surface 1506 all the way to the platform bottom surface 1508.

The interconnect structure 1602 can extend down to the border between the platform bottom surface 1508 and the platform side surface 1506. The interconnect structure 1602 is further shown to be in direct contact with the concave surface of the platform side surface 1506, and the concave surface of the structure side surface 1514.

Figure 17:
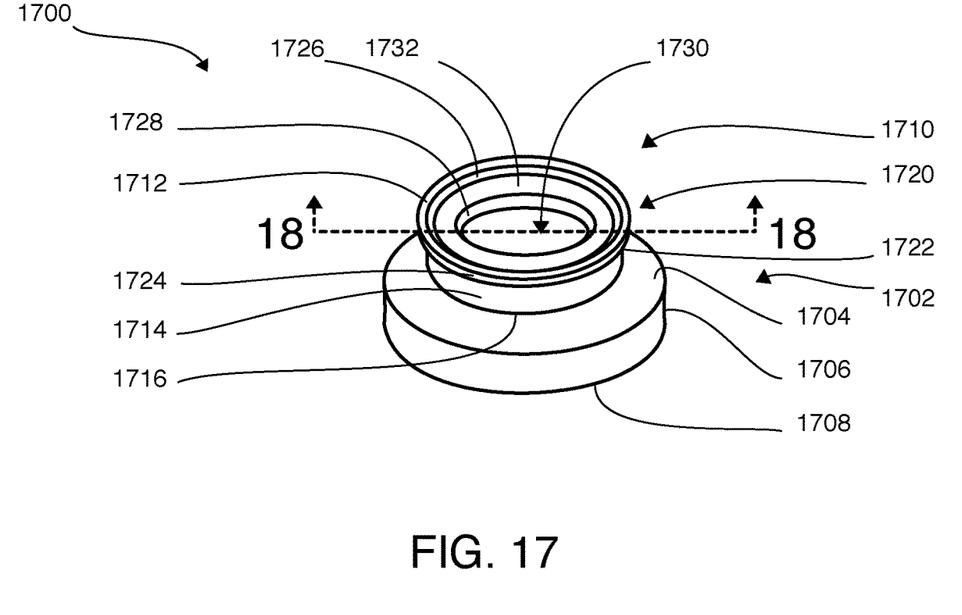
FIG. 17 is an isometric view of the pad system in a third embodiment.

Referring now to FIG. 17, therein is shown an isometric view of the pad system 1700 in a third embodiment. The pad system 1700 is shown having a platform 1702.

The platform 1702 can be a conductive metal such as copper or a metallic alloy. It is further contemplated, for example, that the platform 1702 could be formed of a core material covered by conductive layers, which would thereby form an electrically conductive platform 1702.

The platform 1702 can be formed with a platform top surface 1704, a platform side surface 1706, and a platform bottom surface 1708. The platform top surface 1704 and the platform bottom surface 1708 are depicted as substantially horizontal and parallel to each other.

The platform side surface 1706 can extend vertically between the platform bottom surface 1708 and the platform top surface 1704. The platform side surface 1706 can extend up vertically from the platform bottom surface 1708 to terminate at the platform top surface 1704.

The platform top surface 1704 is depicted having a structure 1710 formed vertically extending therefrom. The structure 1710 can be a conductive metal such as copper or a metallic alloy. It is further contemplated, for example, that the structure 1710 could be formed of a core material covered by conductive layers, which would thereby form an electrically conductive structure 1710.

The structure 1710 and the platform 1702 can be integrally formed as a single solid structure. Alternatively, the structure 1710 and the platform 1702 can be formed as a composite structure comprising an individually formed structure 1710 and an individually formed platform 1702.

The structure 1710 can be formed with a structure top surface 1712, a structure side surface 1714, and a structure bottom surface 1716. The platform top surface 1704 can be in direct contact with the structure bottom surface 1716. The structure top surface 1712 and the structure bottom surface 1716 are depicted as substantially horizontal and parallel to each other, along with the platform top surface 1704 and the platform bottom surface 1708.

The structure top surface 1712 can be formed as a top surface of a flange 1720 on the structure 1710. The flange 1720 can extend between the structure side surface 1714 outward away from the structure side surface 1714.

The flange 1720 can extend from the structure side surface 1714 with an angled flange side 1722. The angled flange side 1722 can terminate in a flange outer surface 1724. The flange outer surface 1724 can be a vertical or substantially vertical side extending from the angled flange side 1722 to the structure top surface 1712.

The structure side surface 1714 can extend vertically between the structure bottom surface 1716 and the angled flange side 1722. The structure side surface 1714 can extend up vertically from the structure bottom surface 1716 and the platform top surface 1704 to terminate at the angled flange side 1722.

The flange 1720 can further include an inner flange surface 1726. The inner flange surface 1726 can mirror the external surface of the structure 1710 including mirroring the angled flange side 1722 and the flange outer surface 1724.

The structure 1710 can further include a structure interior surface 1728 encircling and defining a cavity 1730. The structure interior surface 1728 can extend from the structure bottom surface 1716 vertically toward the flange 1720 and can be parallel to the structure side surface 1714. The inner flange surface 1726 can extend up from an extension intermediate surface 1732. The extension intermediate surface 1732 can extend horizontally from the structure interior surface 1728 to the inner flange surface 1726.

The platform top surface 1704 can be exposed from within the structure 1710, that is from within the cavity 1730 of the structure 1710. The platform top surface 1704 can be bordered and in direct contact with the structure interior surface 1728. It has been discovered that the flange 1720 can decrease alignment failures during interconnect structure formation by increasing the contact area by which the interconnect structure can join to the structure 1710.

As shown, the platform side surface 1706, the structure side surface 1714, and the structure interior surface 1728 can be formed through isotropic etching. Isotropic etching results in the platform side surface 1706, the structure side surface 1714, and the structure interior surface 1728 having a concave shape. It has been discovered that surface etch attributes, including the concave shape, provide increased surface area, outward inclining angles, and overhangs, which greatly enhance sheer strength between the platform 1702 and the interconnect structure 1802 of FIG. 18, as well as between the structure 1710 and the interconnect structure 1802.

Figure 18:
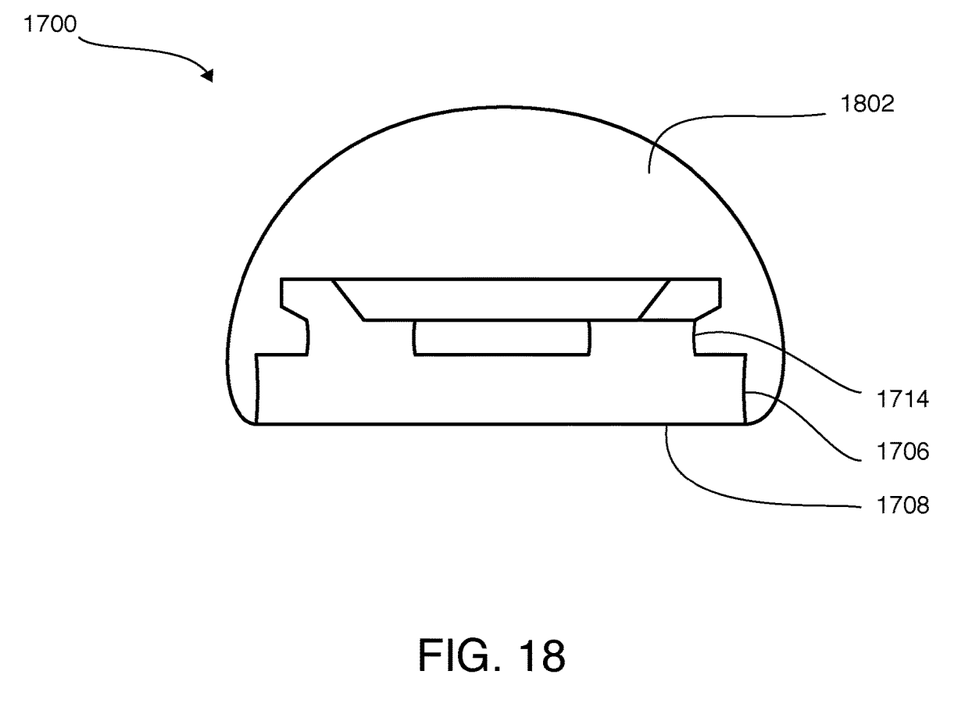
FIG. 18 is a cross-sectional view of the pad system along the line 18-18 of FIG. 17.

Referring now to FIG. 18, therein is shown a cross-sectional view of the pad system 1700 along the line 18-18 of FIG. 17. The pad system 1700 is shown bonded to a non-solder mask defined interconnect such as an interconnect structure 1802. The non-solder mask defined interconnect can provide much better adhesion, than traditional mask defined interconnects, because the interconnect structure 1802 can directly contact the platform side surface 1706 all the way to the platform bottom surface 1708.

The interconnect structure 1802 can extend down to the border between the platform bottom surface 1708 and the platform side surface 1706. The interconnect structure 1802 is further shown to be in direct contact with the concave surface of the platform side surface 1706, and the concave surface of the structure side surface 1714.

Figure 19:
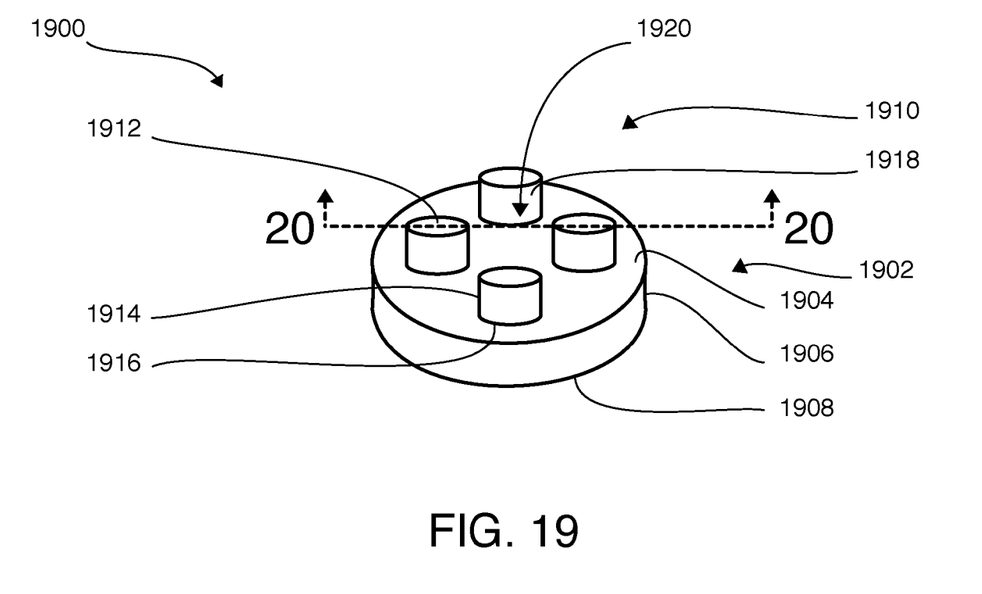
FIG. 19 is an isometric view of the pad system in a fourth embodiment.

Referring now to FIG. 19, therein is shown an isometric view of the pad system 1900 in a fourth embodiment. The pad system 1900 is shown having a platform 1902.

The platform 1902 can be a conductive metal such as copper or a metallic alloy. It is further contemplated, for example, that the platform 1902 could be formed of a core material covered by conductive layers, which would thereby form an electrically conductive platform 1902.

The platform 1902 can be formed with a platform top surface 1904, a platform side surface 1906, and a platform bottom surface 1908. The platform top surface 1904 and the platform bottom surface 1908 are depicted as substantially horizontal and parallel to each other.

The platform side surface 1906 can extend vertically between the platform bottom surface 1908 and the platform top surface 1904. The platform side surface 1906 can extend up vertically from the platform bottom surface 1908 to terminate at the platform top surface 1904.

The platform top surface 1904 is depicted having structures 1910 formed vertically extending therefrom. The structures 1910 can be conductive metal such as copper or a metallic alloy. It is further contemplated, for example, that the structures 1910 could be formed of a core material covered by conductive layers, which would thereby form electrically conductive structures 1910.

The structures 1910 and the platform 1902 can be integrally formed as a single solid structure. Alternatively, the structures 1910 and the platform 1902 can be formed as a composite structure comprising an individually formed structures 1910 and an individually formed platform 1902.

The structures 1910 are depicted as cylindrical extensions arranged uniformly in direct contact with the platform top surface 1904. Alternative embodiments are contemplated. These alternative embodiments include different numbers of the structures 1910, different geometric shapes of the structures 1910, and different arrangement of the structures 1910.

The structures 1910 can be formed with structure top surfaces 1912, structure side surfaces 1914, and structure bottom surfaces 1916. The platform top surface 1904 can be in direct contact with the structure bottom surfaces 1916. The structure top surfaces 1912 and the structure bottom surfaces 1916 are depicted as substantially horizontal and parallel to each other, along with the platform top surface 1904 and the platform bottom surface 1908.

The structure side surfaces 1914 can extend vertically between the structure bottom surfaces 1916 and the structure top surfaces 1912 for each of the structures 1910. The structure side surfaces 1914 can extend up vertically from the structure bottom surfaces 1916 and the platform top surface 1904 to terminate at the structure top surfaces 1912.

A portion of the structure side surfaces 1914 can face each other and be considered structure interior surfaces 1918 around and defining a cavity 1920 therebetween. The structure interior surfaces 1918 can extend from the structure bottom surface 1916 vertically toward the structure top surface 1912 and can be a portion of the structure side surfaces 1914.

The platform top surface 1904 can be exposed from within the structure 1910, that is from within the cavity 1920 of the structures 1910. The platform top surface 1904 can be bordered and in direct contact with the structure interior surfaces 1918.

As shown, the platform side surface 1906, and the structure side surfaces 1914 can be formed through isotropic etching. Isotropic etching results in the platform side surface 1906, and the structure side surfaces 1914 having a concave shape. It has been discovered that surface etch attributes, such as the concave shape, provide increased surface area, outward inclining angles, and overhangs, which greatly enhance sheer strength between the platform 1902 and the interconnect structure 2002 of FIG. 20, as well as between the structure 1910 and the interconnect structure 2002.

Figure 20:
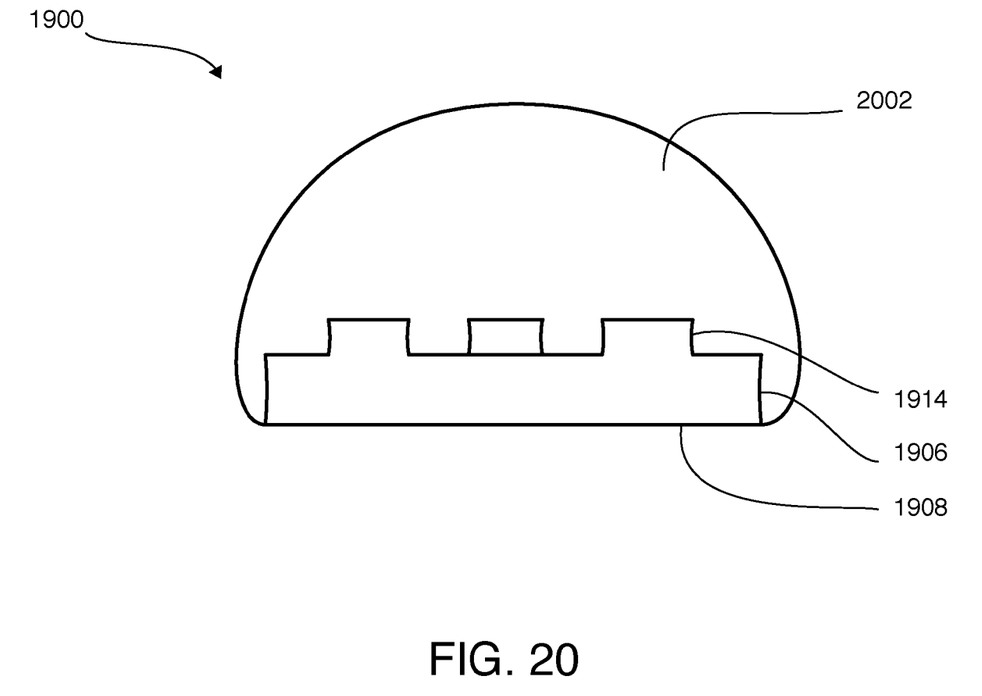
FIG. 20 is a cross-sectional view of the pad system along the line 20-20 of FIG. 19.

Referring now to FIG. 20, therein is shown a cross-sectional view of the pad system 1900 along the line 20-20 of FIG. 19. The pad system 1900 is shown bonded to a non-solder mask defined interconnect such as an interconnect structure 2002. The non-solder mask defined interconnect can provide much better adhesion, than traditional mask defined interconnects, because the interconnect structure 2002 can directly contact the platform side surface 1906 all the way to the platform bottom surface 1908.

The interconnect structure 2002 can extend down to the border between the platform bottom surface 1908 and the platform side surface 1906. The interconnect structure 2002 is further shown to be in direct contact with the concave surface of the platform side surface 1906, and the concave surface of the structure side surfaces 1914.

Figure 21:
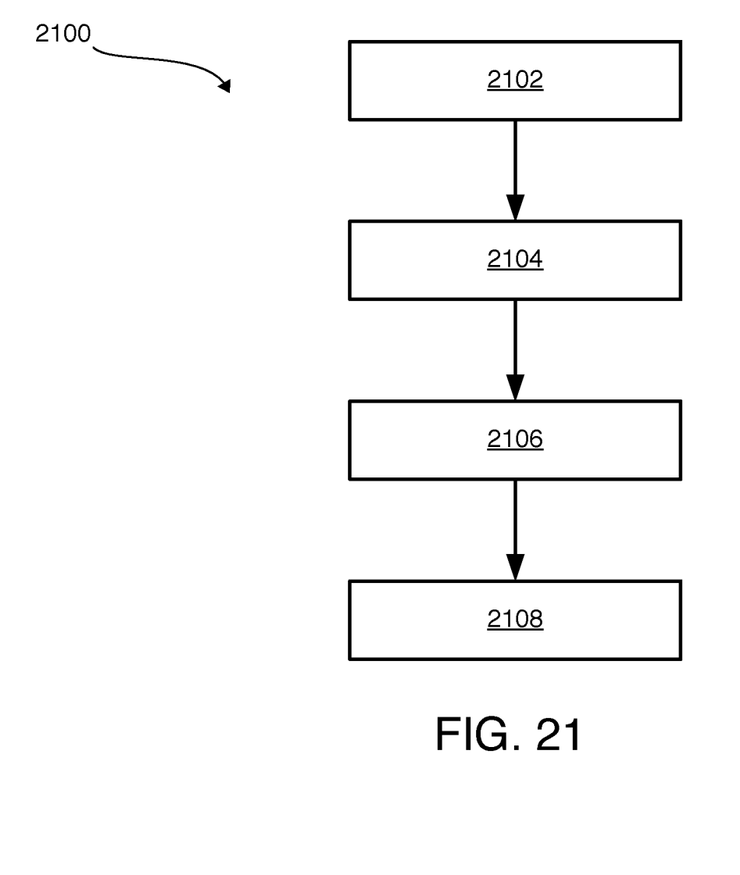
FIG. 21 is a control flow for manufacturing the disclosed pad system.

Referring now to FIG. 21, therein is shown a control flow 2100 for manufacturing the disclosed pad system. The control flow can include providing a core substrate having a core top surface in a block 2102; coupling a platform to the core substrate, the platform having etch attributes, a platform top surface, and a platform side surface, and the platform side surface extended between the core top surface and the platform top surface in a block 2104; forming a structure on the platform, the structure including a structure side surface extended up from the platform top surface terminating in a structure top surface, the structure including a structure interior surface defining a cavity within the structure, the platform top surface exposed from within the cavity in a block 2106; and adhering an interconnect structure to the platform and the structure, the interconnect structure conforming with an exterior shape of the platform side surface in combination with the structure for locking the interconnect structure onto the platform and the structure, the interconnect structure including an intermetallic compound formed within the interconnect structure, and the intermetallic compound extends along the platform side surface, the platform top surface, the structure side surface, the structure top surface, and the structure interior surface in a block 2108.

Thus, it has been discovered that the pad system furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

While the pad system has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

What is claimed is:

1. A vertically structured pad system comprising:
   a platform having etch attributes, a platform top surface, and a platform side surface;
   a structure on the platform, the structure including a structure side surface extended up from the platform top surface terminating in a structure top surface, the structure including a structure interior surface defining a cavity within the structure, and the platform top surface exposed from within the cavity; and an interconnect structure adhered to the platform and the structure, the interconnect structure conforming with an exterior shape of the platform side surface in combination with the structure for locking the interconnect structure onto the platform and the structure.

2. The system of claim 1 further comprising a flange extended between the structure side surface and the structure top surface, and the flange extended outward away from the structure side surface.

3. The system of claim 1 further comprising a conductive coating deposited on the platform and the structure.

4. The system of claim 1 further comprising a channel through the structure, the channel extended from the structure interior surface to the structure side surface.

5. The system of claim 1 further comprising a second structure having a second interior surface, the structure interior surface facing the second interior surface around and defining the cavity therebetween.

6. A vertically structured pad system comprising:
a core substrate having a core top surface;
a platform having etch attributes, a platform top surface, and a platform side surface, the platform coupled to the core substrate, and the platform side surface extended between the core top surface and the platform top surface;
a structure on the platform, the structure including a structure side surface extended up from the platform top surface terminating in a structure top surface, the structure including a structure interior surface defining a cavity within the structure, the platform top surface exposed from within the cavity; and
an interconnect structure adhered to the platform and the structure, the interconnect structure conforming with an exterior shape of the platform side surface in combination with the structure for locking the interconnect structure onto the platform and the structure, the interconnect structure including an intermetallic compound formed within the interconnect structure, and the intermetallic compound extends along the platform side surface, the platform top surface, the structure side surface, the structure top surface, and the structure interior surface.

7. The system of claim 6 wherein the structure side surface includes the etch attributes from being etched from a single conductive layer containing the structure and the platform.

8. The system of claim 6 further comprising a deposition seam between the structure and the platform formed by depositing the structure onto the platform.

9. The system of claim 6 further comprising a solder resist extended around the platform and above the structure top surface.

10. The system of claim 6 further comprising interconnects formed on the core substrate for electrically coupling the platform with a component through the core substrate.

11. A method of manufacturing a vertically structured pad system comprising:
providing a platform having etch attributes, a platform top surface, and a platform side surface;
forming a structure on the platform, the structure including a structure side surface extended up from the platform top surface terminating in a structure top surface, the structure including a structure interior surface defining a cavity within the structure, and the platform top surface exposed from within the cavity; and
adhering an interconnect structure to the platform and the structure, the interconnect structure conforming with an exterior shape of the platform side surface in combination with the structure for locking the interconnect structure onto the platform and the structure.

12. The method of claim 11 wherein forming the structure includes forming a flange extended between the structure side surface and the structure top surface, and the flange extended outward away from the structure side surface.

13. The method of claim 11 further comprising depositing a conductive coating on the platform and the structure.

14. The method of claim 11 further comprising forming a channel through the structure, the channel extended from the structure interior surface to the structure side surface.

15. The method of claim 11 further comprising forming a second structure having a second interior surface, the structure interior surface facing the second interior surface around and defining the cavity therebetween.

16. The method of claim 11 further comprising:
providing a core substrate having a core top surface, the platform coupled to the core substrate and the platform side surface extended between the core top surface and the platform top surface; and
wherein:
adhering the interconnect structure to the platform and the structure includes forming an intermetallic compound within the interconnect structure, and the intermetallic compound extends along the platform side surface, the platform top surface, the structure side surface, the structure top surface, and the structure interior surface.

17. The method of claim 16 wherein forming the structure includes etching the structure from a single conductive layer containing the structure and the platform, and forming the etch attributes in the structure side surface.

18. The method of claim 16 further comprising depositing the structure onto the platform with a deposition seam between the structure and the platform from depositing the structure onto the platform.

19. The method of claim 16 further comprising depositing a solder resist extended around the platform and above the structure top surface.

20. The method of claim 16 further comprising forming interconnects on the core substrate for electrically coupling the platform with a component through the core substrate.

\* \* \* \* \*